United States Patent
Eldesouki et al.

(10) Patent No.: US 9,817,935 B2
(45) Date of Patent: Nov. 14, 2017

(54) INTERLACED BI-SENSOR SUPER-RESOLUTION ENHANCEMENT

(71) Applicant: King Abdulaziz City for Science and Technology, Riyadh (SA)

(72) Inventors: Munir Eldesouki, Riyadh (SA); Faisal Muhammed Al-Salem, Riyadh (SA)

(73) Assignee: KING ABDULAZIZ CITY FOR SCIENCE AND TECHNOLOGY, Riyadh (SA)

(*) Notice: Subject to any disclaimer, the term of this patent is extended or adjusted under 35 U.S.C. 154(b) by 416 days.

(21) Appl. No.: 14/334,249

(22) Filed: Jul. 17, 2014

(65) Prior Publication Data

US 2016/0019329 A1    Jan. 21, 2016

(51) Int. Cl.
| | | |
|---|---|---|
| *G06F 17/50* | (2006.01) | |
| *H04N 5/369* | (2011.01) | |
| *H01L 27/146* | (2006.01) | |
| *G06T 3/40* | (2006.01) | |
| *H04N 5/225* | (2006.01) | |
| *H04N 5/347* | (2011.01) | |

(52) U.S. Cl.
CPC ........ *G06F 17/5072* (2013.01); *G06T 3/4053* (2013.01); *H01L 27/1461* (2013.01); *H01L 27/14605* (2013.01); *H01L 27/14634* (2013.01); *H04N 5/2258* (2013.01); *H04N 5/347* (2013.01); *H04N 5/3696* (2013.01); *H01L 27/14643* (2013.01)

(58) Field of Classification Search
CPC ............. G06F 17/5072; H01L 27/1461; H01L 27/14634; H01L 27/14605; H01L 27/14643; H04N 5/3696; H04N 5/347; H04N 5/2258; G06T 3/4053
See application file for complete search history.

(56) References Cited

U.S. PATENT DOCUMENTS

| | | | |
|---|---|---|---|
| 8,665,342 B2 | 3/2014 | Al-Salem et al. | |
| 2010/0097514 A1* | 4/2010 | McCarten | H01L 27/14634 348/340 |
| 2013/0076910 A1* | 3/2013 | Scott | H04N 5/332 348/164 |
| 2015/0312492 A1* | 10/2015 | Kim | H01L 27/14612 348/308 |

OTHER PUBLICATIONS

Salem, et. al., "Non-Parametric Super-Resolution Using a Bi-Sensor Camera", IEEE Transactions on Multimedia, vol. 15, No. 1, Jan. 2013, pp. 27-40.

* cited by examiner

*Primary Examiner* — Nha Nguyen
(74) *Attorney, Agent, or Firm* — Andrew M. Calderon; Roberts Mlotkowski Safran Cole & Calderon, P.C.

(57) ABSTRACT

Interlaced bi-sensor super-resolution enhancement techniques and a resultant scalable pixel array suitable for a mega-pixel design are disclosed. The method includes interlacing a first array of pixels of a first size with a second array of pixels of a second size. The interlacing of the first array of pixels with the second array of pixels avoids crossing two or more photosensitive areas of the first array of pixels and the second array of pixels.

15 Claims, 5 Drawing Sheets

Array A overlapping Array B
Block of 5x5 Primary Pixels (Array A)

Array A overlapping Array B

Block of 5x5 Primary Pixels (Array A)

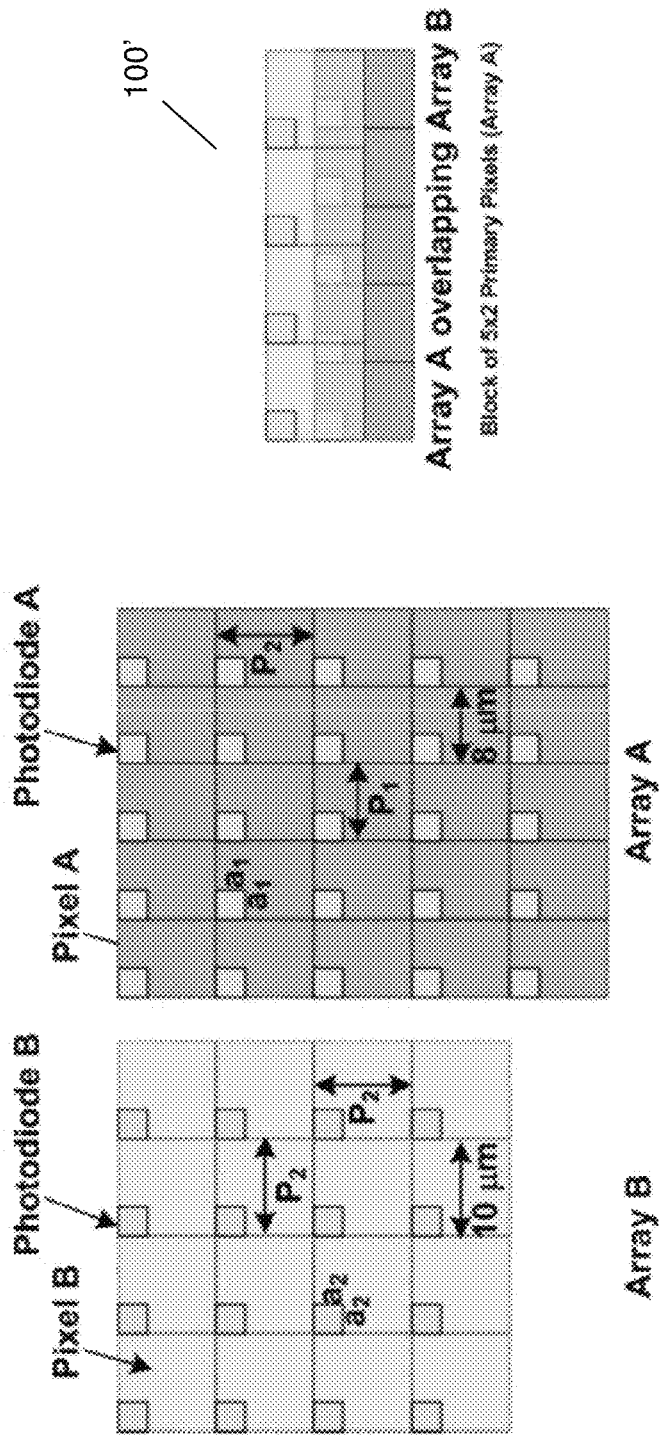

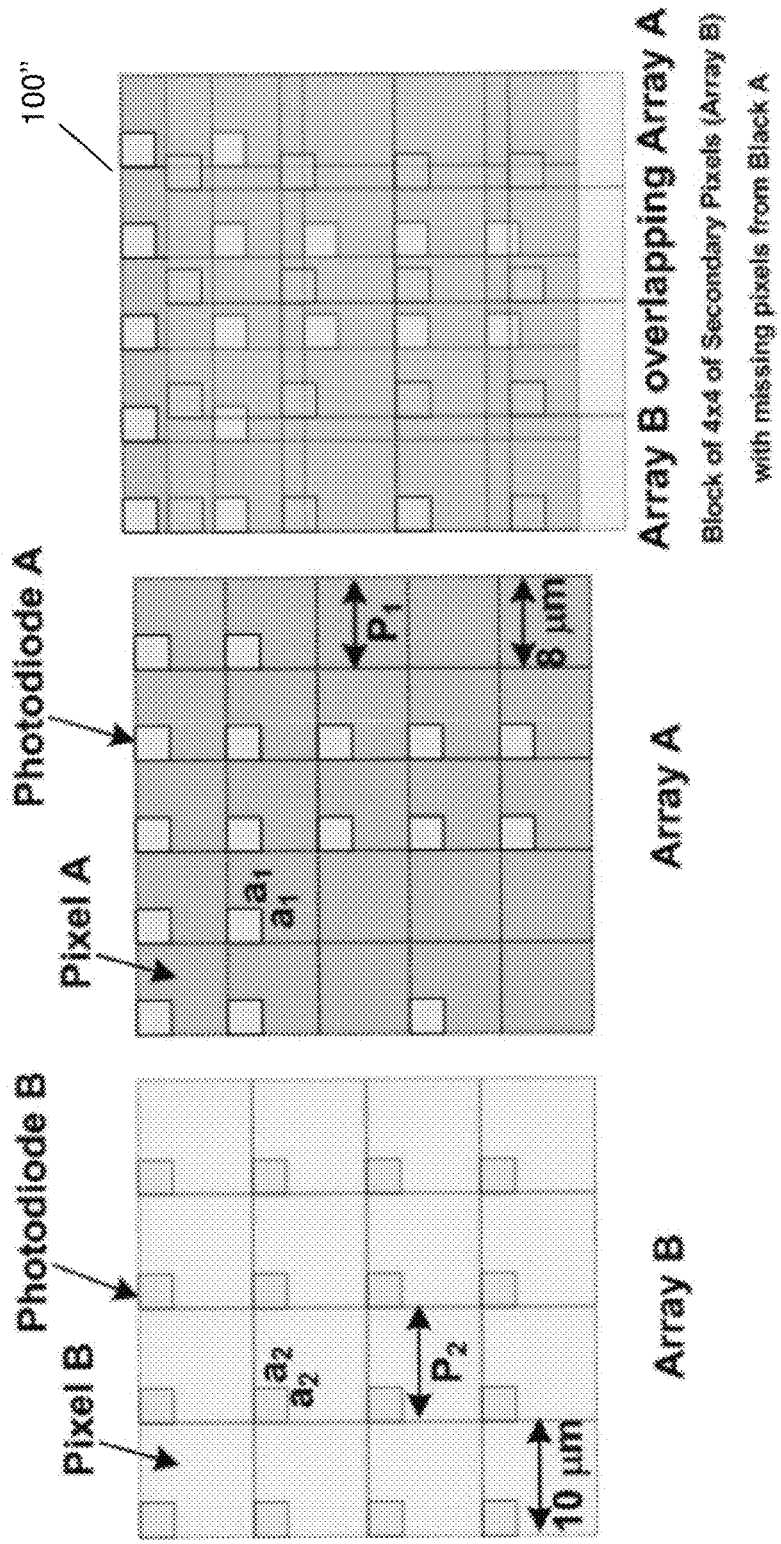

INTERLACED BI-SENSOR SUPER-RESOLUTION ENHANCEMENT

FIELD OF THE INVENTION

The invention relates to enhancement of images and, more particularly, to interlaced bi-sensor super-resolution enhancement techniques and a resultant scalable pixel array suitable for a mega-pixel design.

BACKGROUND OF THE INVENTION

Enhancing the resolution of an image of a camera can be important for many different applications. For example, enhancing resolution of an image can find application in surveillance, military and defense, aerospace, traffic control, medical imaging, and commercial applications such as smart phones that do not have the luxury of large sensor size.

One approach of enhancing a resolution of an image is through software algorithms. For example, a common way to enhance a resolution is through super-resolution techniques depending on software post-processing algorithms. These software post-processing algorithms can be applicable to multi-framed or single-frame, where the effectiveness depends on the scene.

Another approach may be to use two sensors (bi-sensor super resolution); however, there is an increased cost associated with this method. The increased cost is not only due to the need of two sensors, but also due to needing two full cameras, which in turn, requires two lenses (large, bulky, expensive), two processors, two batteries, two separate output streams, etc. Additionally, a bi-sensor approach also requires ensuring identical optical paths for both sensors, which requires the use of a beamsplitter and a calibrated optical setup. This significantly increases complexity.

SUMMARY OF THE INVENTION

In an aspect of the invention, a method comprises interlacing a first array of pixels of a first size with a second array of pixels of a second size. The interlacing of the first array of pixels with the second array of pixels avoids crossing two or more photosensitive areas of the first array of pixels and the second array of pixels.

In an aspect of the invention, a method comprises: selecting a first array of pixels comprising pixels of a first pitch; selecting a second array of pixels comprising pixels of a second pitch which is different than the first pitch; and interlacing the first array of pixels and the second array of pixels to form a repeatable modular block for an interlaced bi-sensor super-resolution pixel array while avoiding crossing of photosensitive areas of the first array of pixels and the second array of pixels.

In an aspect of the invention, a repeatable modular block of interlaced bi-sensor super-resolution pixel array comprises a first array of pixels comprising pixels of a first pitch interlaced with a second array of pixels comprising pixels of a second pitch which is different than the first pitch such that photosensitive areas of the first array of pixels and the second array of pixels are minimized.

In an aspect of the invention, a computer system for interlacing pixel arrays, comprises: a CPU, a computer readable memory and a computer readable storage media; program instructions to select a first array of pixels comprising pixels of a first pitch; program instructions to select a second array of pixels comprising pixels of a second pitch which is different than the first pitch; and program instructions to interlace the first array of pixels and the second array of pixels to form a repeatable modular block for an interlaced bi-sensor super-resolution pixel array while avoiding crossing of photosensitive areas of the first array of pixels and the second array of pixels; wherein the program instructions are stored on the computer readable storage media for execution by the CPU via the computer readable memory.

BRIEF DESCRIPTION OF THE DRAWINGS

The present invention is described in the detailed description which follows, in reference to the noted plurality of drawings by way of non-limiting examples of exemplary embodiments of the present invention.

FIG. 3 shows two pixel arrays which can be combined into a dual array single sensor;

FIG. 4 represents an interlacing of the two pixel arrays shown in FIG. 3;

FIG. 5 shows two pixel arrays which can be combined into a dual array single sensor;

FIG. 6 represents an interlacing of the two pixel arrays shown in FIG. 5;

DETAILED DESCRIPTION OF THE INVENTION

The invention relates to enhancement of images and, more particularly, to interlaced bi-sensor super-resolution enhancement techniques and a resultant scalable sensor array suitable for a mega-pixel design. For example, the present invention provides a method to form building blocks of pixel arrays for copy and paste operations to form a pixel sensor array suitable for a mega-pixel design. In this way, the invention can be implemented in an interlaced bi-sensor super-resolution camera.

More specifically, the present invention provides a dual-array, single image sensor with different pitch interlaced pixels, especially used for super resolution (SR) of images. Advantageously, the method of the present invention satisfies the sampling rate diversity requirement in only one single sensor; compared to the need for two sensors to satisfy its different sampling rate requirement of conventional methods and systems.

In embodiments, the sensor design interlaces two image sensor arrays within one sensor. The two interlaced arrays have a different pitch that will allow this dual array single sensor to function as a bi-sensor super-resolution camera. The array has pixels that are laid out in a modular (repeatable) block that will allow for typical image sensor array layout and which provides the capabilities of copy and paste operations to build a scalable pixel array sensor suitable for mega-pixel design. In this way, the present invention advantageously results in a very simplified sensor that cost the same as a single camera single image sensor setup and has no major sacrifice to silicon area.

The sensor design of the present invention can be manufactured in a number of ways using a number of different tools. In general, though, the methodologies and tools are used to form structures with dimensions in the micrometer and nanometer scale. The methodologies, i.e., technologies, employed to manufacture the sensor design of the present invention have been adopted from integrated circuit (IC) technology. For example, the structures of the present invention are built on wafers and are realized in films of material patterned by photolithographic processes on the top of a wafer. In particular, the fabrication of the sensor design of the present invention uses three basic building blocks: (i) deposition of thin films of material on a substrate, (ii) applying a patterned mask on top of the films by photolithographic imaging, and (iii) etching the films selectively to the mask. The layout of the present invention is applicable to different technologies including, for example, CMOS 180 nm technology from Global Foundries as well as LF 150 nm technology, by KACST.

Figure 1:
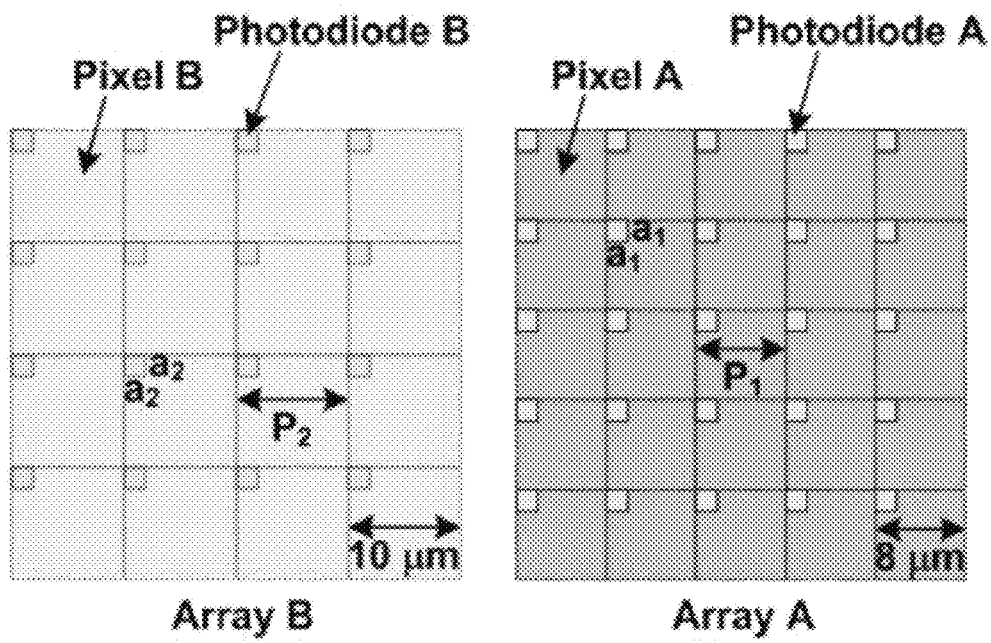
FIG. 1 shows two pixel arrays which can be combined into a dual array single sensor.
Figure 2:
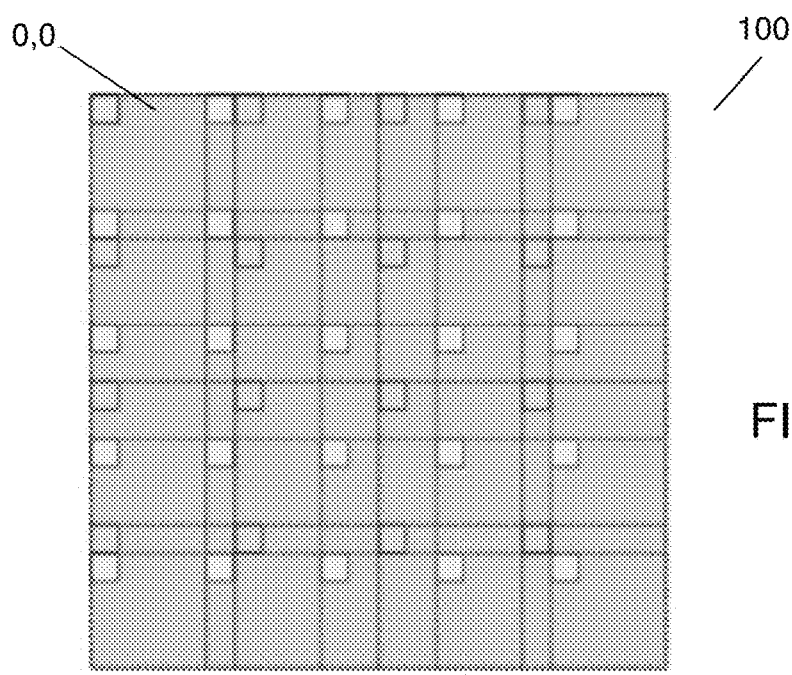
FIG. 2 represents an interlacing of the two pixel arrays shown in FIG. 1.

FIG. 1 shows two arrays, Array A and Array B which can be combined into a dual array single sensor to function as bi-sensor super-resolution camera or building blocks as shown in FIG. 2. In the non-limiting illustrative example of FIG. 1, Array B is shown in a block of 4×4, while Array A is shown in a block of 5×5; although other block sizes are contemplated by the present invention. The pitch of Array A is labeled $P_1$ and the pitch of Array B is labeled $P_2$.

In embodiments, Array A has pixels (Pixel A) of a smaller area (smaller pitch in both dimensions horizontal and vertical) with a specific ratio when compared to Array B (that has Pixel B). In this example, Pixel B has a pitch that is 1.25 times that of Pixel A, therefore, in the example of FIG. 1, Pixel A has a pitch of 8 µm and Pixel B has a pitch of 10 µm, which is a ratio of 1.25. This case is only specific to the example ratio of 1.25, where other ratios may require different block sizes. It should be understood by those of skill in the art, that other pitches or different block sizes are thus contemplated by the present invention.

As further noted herein, it should be understood by those of skill in the art that the pixels contain a photodiode that it is usually smaller than the size of the pixel to leave room for the electronics required for pixel conditioning and control (e.g., such as the 3-transistor active pixel sensor design). The room for electronics is necessary in almost all CMOS image sensor design, except for the case of back-side illumination technology, where the electronics are integrated in a different layer than the photodiode. For these reasons, the present invention contemplates the need for different pitches for the different arrays in order to prevent blockage (e.g., crossover) of photosensitive areas as described herein when interlaced as shown in FIG. 2.

Also, in the example of FIG. 1, the pixels and photodiodes are assumed to be squares; although other shapes and sizes are contemplated by the present invention. Finally, the areas of the photodiodes are assumed to be equal ($a_1 \times a_1 = a_2 \times a_2$) to maintain similar dynamic range, sensitivity and responsivity characteristics between the two arrays.

FIG. 2 represents both of the arrays (Array A and Array B) overlapped in an interlaced manner without crossing photosensitive areas in accordance with aspects of the present invention, e.g., dual array single sensor. The dual array single sensor is more specifically representative of a repeatable, scalable modular block which can be used for a dual array single sensor suitable for a mega-pixel design.

As should be understood, a cross in two or more photosensitive areas may result in a variation of the pixel pitch. In FIG. 2, for example, at pixel (0,0), the first pixel on the top left corner, both photodiodes overlap fully, meaning that only one photodiode laid out in that location can serve for both pixels. Also, some of the photodiodes may come in close proximity of each other; although, this is not an issue in FIG. 2. However, it may be an issue in some layouts as there is a minimum well spacing between the photodiodes to avoid design rule check (DRC) violation. Accordingly, in implementing the present invention, a determination is made as to the minimum well spacing between the photodiodes to avoid design rule check (DRC) violation.

Using the infrastructure of FIG. 6, the condition to avoid overlap between square or rectangular photodiodes to result in the interlaced array of FIG. 2 can be derived as follows:

$$P_2 > P_1 \tag{1}$$

$$P_2 = s \times P_1 \tag{2}$$

$$s = \text{scaling factor (in this case 1.25)} \tag{3}$$

$$a = P_2 - P_1 - \text{min\_spacing\_rule} \tag{4}$$

It should be understood that "a" represents the size of the photodiode and $a^2$ is thus representative of the area of the photodiode. It should be further understood that the present invention is not limited to a scaling factor of 1.25, and that other scaling factors can be implemented with the present invention, based on size of the pixels or arrays and other considerations described herein, e.g., avoidance of crossing any of the photosensitive areas (blockage of photosensitive areas when arrays are overlapped). For example, the scaling factor can be based on (i+1)/i, where i is representative of an array, e.g., a 4×4 array will result in (4+1)/4 which equals 1.25 scaling factor. In embodiments, an upscaling factor (e.g., "s") can be based on a 1 megabyte pixel in, e.g., a 6×6 array (36 megabyte array), where the scaling factor can be, e.g., (6+1)/6 which equals 1.17.

For the case shown in the 5×5 block of FIG. 1, with pixel pitch of 8 µm and 10 µm, and a minimum well spacing rule of 0.1 (with all units in micrometers), as an example:

$$P_2 = 1.25 \times P_1 \tag{5}$$

$$a = 1.9 \tag{6}$$

The minimum well spacing rule is technology dependent and, as such, the minimum well spacing rule of 0.1 is provided as an illustrative example. The fill-factor (FF), which is a ratio of photosensitive part of the pixel to entire pixel area, can be estimated depending on the number of photosensitive parts of the pixel, which varies between 2 to 4, as follows:

$$2a^2/P_2^2 < FF < 4a^2/P_2^2 \tag{7}$$

It should be understood that the interlaced array 100 of FIG. 2 can be used as a building block for a dual array single sensor. For example, the building block of FIG. 2 can be used in copy and paste design processes known to those of skill in the art to complete a scalable array suitable for a mega-pixel design. For example, the present invention can be provided in design processes which preferably employ and incorporate hardware and/or software modules for synthesizing, translating, or otherwise processing a design/simulation functional equivalent of the components, circuits, devices, or logic structures shown in FIG. 2 to generate a netlist which may contain equivalent design structures of the array of FIG. 2. Netlist may comprise, for example, compiled or otherwise processed data structures representing a list of wires, discrete components, logic gates, control circuits, I/O devices, models, etc. that describes the connections to other elements and circuits in an integrated circuit design of FIGS. 1 and 2. Resulting design structures, representative of the arrays of FIGS. 1 and 2, can reside on a storage medium or programmable gate array in a data format used for the exchange of data of mechanical devices and structures (e.g. IGES, DXF, Parasolid XT, JT, DRG, GDSII (GDS2), GL1, OASIS, etc.). The design structure when processed by an ECAD system generates a logically or otherwise functionally equivalent form of one or more of the embodiments of the invention shown in FIG. 2 (and FIGS. 4, 6 and 8).

FIGS. 3 and 4 provide alternative processes to provide an interlaced array in accordance with aspects of the present invention. In FIGS. 3 and 4, though, super resolution can be performed using only one dimensional dual pitch, instead of two. That is, FIG. 3 shows a scaling in one dimension, e.g., horizontal (but not both horizontal and vertical). In this case, the FF can be increased significantly. Also in this case, the repeatable modular block will be smaller, as shown in FIG. 4 (compared to FIG. 2).

More specifically, FIG. 3 shows two arrays, Array A and Array B which can be combined into a dual array single sensor to function as a bi-sensor super-resolution camera as shown in FIG. 4. More specifically, the interlaced array 100' of FIG. 4 is representative of a repeatable, scalable modular block which can be used to for a dual array single sensor suitable for a mega-pixel design.

In the non-limiting illustrative example of FIG. 3, Array B is shown in a block of 4×4, while Array A is shown in a block of 5×5. The pitch of Array A is $P_1$ (horizontal) and $P_2$ (vertical), whereas, the pitch of Array B is $P_2$ for both horizontal and vertical. Hence, Array A has rectangular pixels and Array B has square pitches. In embodiments, Array A has pixels (Pixel A) of a smaller area (smaller pitch in the horizontal) with a specific ratio when compared to Array B (that has Pixel B). Finally, the areas of the photodiodes are assumed to be equal ($a_1 x a_1 = a_2 x a_2$) to maintain similar dynamic range, sensitivity and responsively characteristics between the two arrays.

As shown in FIG. 4, using the equations above it is now possible to obtain a modular, repeatable, scalable modular block 100' of 5×2 primary pixels, as a minimum building block. As in the representation of FIG. 2, the modular, repeatable building block of FIG. 4 can be used for a dual array single sensor suitable for a mega-pixel design. Although not as effective as the building block shown in FIG. 2, the building block of FIG. 4 will provide enhanced resolution. Also, it should be understood by those of skill in the art that an upscale factor need only be used in a single dimension in this implementation which, accordingly, will only increase the bit size in one dimension. Similar to that explained with regard to FIG. 2, the building blocks of FIG. 4 can be used as repeatable, scalable modular blocks 100' suitable for a mega-pixel design. For example, the building block of FIG. 2 can be used in copy and paste design processes known to those of skill in the art to complete a dual array single sensor.

As shown in FIGS. 5 and 6, using a variable sampling rate for the primary data set (Array A) can help increase the FF. For example, in FIG. 5, Array B has a pitch $P_2$ (10 units) that is larger than Array A by a factor of 1.25. The photodiodes in this case are larger than the condition derived in equation 6, which results in some of the photodiodes in the 4×4 block overlapping. However, as shown in FIG. 6, some of the photodiodes of the Array A are removed in order to avoid DRC errors or to avoid modifying the pitch of Array B. The result of the interlaced layout 100" is shown in FIG. 6, where Array A samples are 36% less than the original case for Array A or 20% of both arrays together. This was tested and shown not to have any significant impact on the enhanced images, in that known software algorithms can extrapolate for the missing photodiodes, while still providing enhanced imagery.

Figures 7, 8:
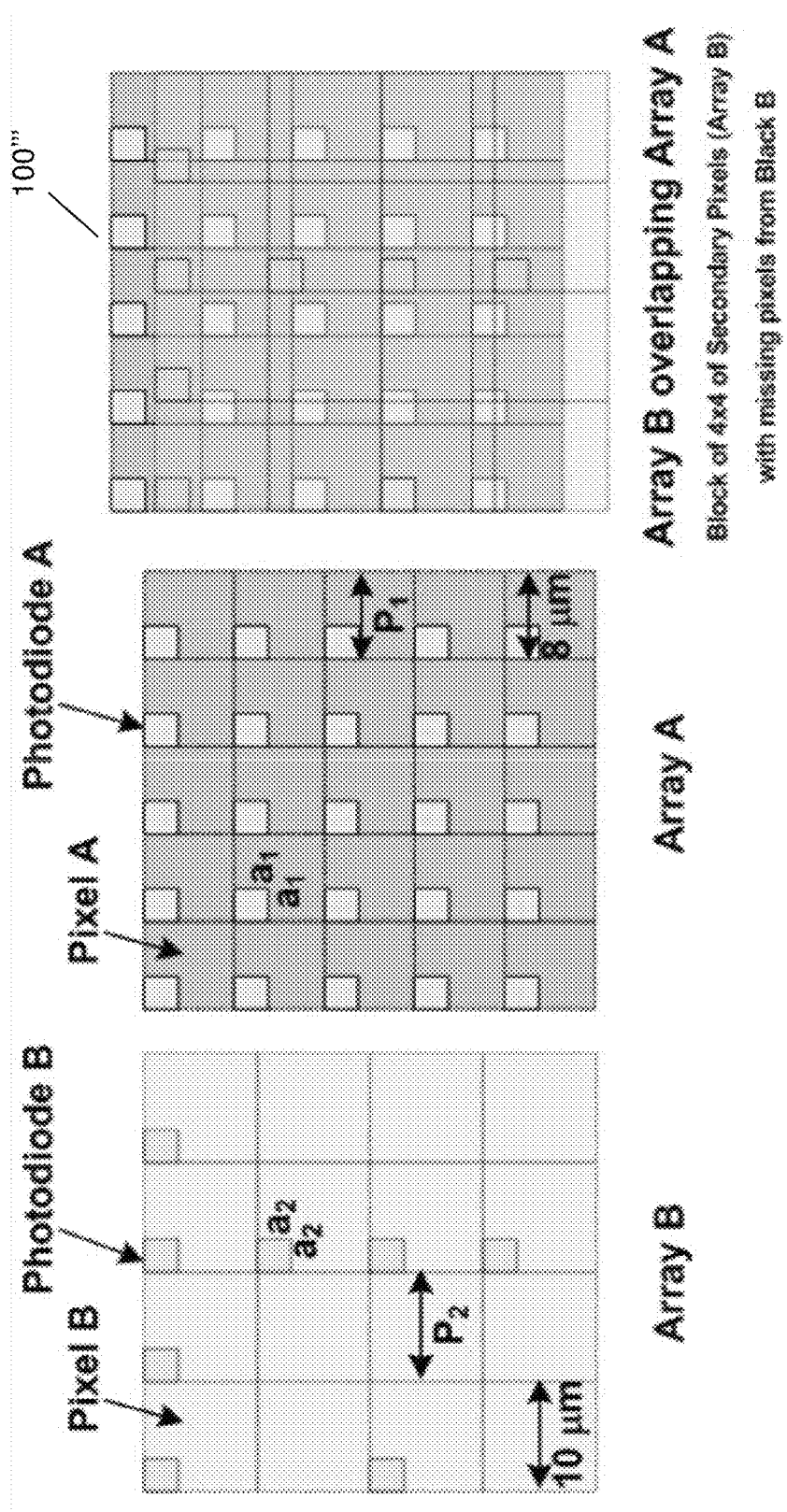
FIG. 7 shows two pixel arrays which can be combined into a dual array single sensor.
FIG. 8 represents an interlacing of the two pixel arrays shown in FIG. 7.

As shown in FIG. 7, a variable sampling rate can also be implemented by removing pixels from secondary array (Array B), as shown in FIG. 8. A shown in the interlaced layout 100''' of FIG. 8, Array B samples are 50% less than the original case, also only 20% less than both arrays together. This was also tested and shown not to have any significant impact on the enhanced images. It should be understood by those of skill in the art that any combination of pixels can be removed from the primary array (Array A) or the secondary array (Array B) in order to avoid crossover of the pixels, as described herein.

The present invention may be embodied as a system, method or computer program product. The present invention may take the form of a hardware embodiment, a software embodiment or a combination of software and hardware. Furthermore, the present invention may take the form of a computer program product (program instructions) embodied in any tangible storage medium of expression having computer-usable program code embodied in the medium, which implements the methods, techniques and processes herein. The computer readable storage media may be any medium that can contain, store, or communicate the program for use by or in connection with the instruction execution system, apparatus, or device. The computer readable storage media is not a signal per se, or transitory. The computer-usable or computer-readable medium may be, for example, an electronic, magnetic, optical, electromagnetic, infrared, or semiconductor system, apparatus, device, or propagation medium.

Figure 9:
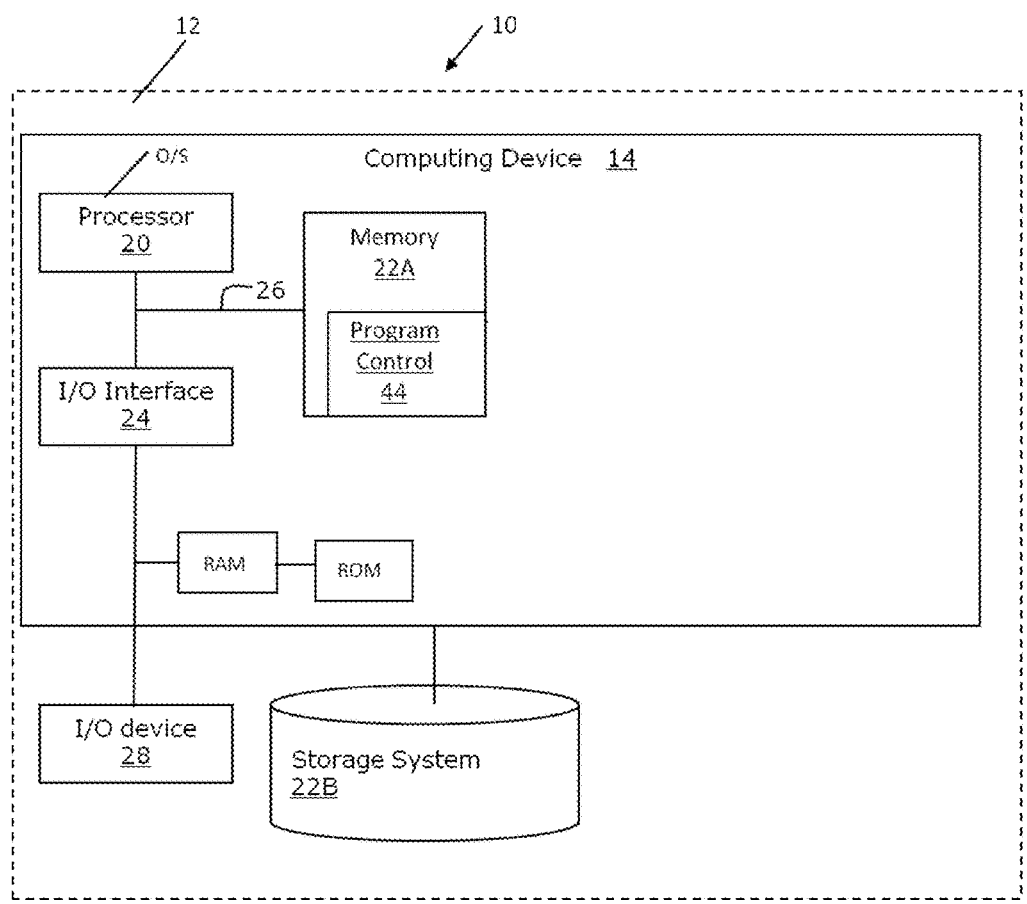
FIG. 9 shows a computing infrastructure to implement aspects of the present invention.

FIG. 9 shows an illustrative environment 10 for managing the processes in accordance with the invention. The environment 10 includes a server or other computing system 12 that can perform the processes described herein. The server 12 includes a computing device 14 which can be resident on a network infrastructure or computing device. The computing device 14 includes a processor (CPU) 20, memory 22A, an I/O interface 24, and a bus 26. In addition, the computing device includes random access memory (RAM), a read-only memory (ROM), and an operating system (O/S). The computing device 14 is in communication with the external I/O device/resource 28 and the storage system 22B. The I/O device 28 can comprise any device that enables an individual to interact with the computing device 14 (e.g., user interface) or any device that enables the computing device 14 to communicate with one or more other computing devices using any type of communications link. The processor 20 executes computer program code (e.g., program control or program instructions 44), which can be stored in the memory 22A and/or storage system 22B. While executing the computer program code, the processor 20 can read and/or write data to/from memory 22A, storage system 22B, and/or I/O interface 24. The program code executes the processes of the invention.

In embodiments, the present invention comprises the CPU, computer readable memory and computer readable storage media. In particular embodiments, program instructions are configured to select a first array of pixels comprising pixels of a first pitch. Program instructions are configured to select a second array of pixels comprising pixels of a second pitch which is different than the first pitch. Program instructions are configured to interlace the first array of pixels and the second array of pixels to form a repeatable modular block for an interlaced bi-sensor super-resolution pixel array while avoiding crossing of photosensitive areas of the first array of pixels and the second array of pixels. Program instructions are configured to provide the other methods, steps and techniques already described herein. The program instructions are stored on the computer readable storage media for execution by the CPU via the computer readable memory.

The foregoing examples have been provided for the purpose of explanation and should not be construed as limiting the present invention. While the present invention has been described with reference to an exemplary embodiment, Changes may be made, within the purview of the appended claims, without departing from the scope and spirit of the present invention in its aspects. Also, although the present invention has been described herein with reference to particular materials and embodiments, the present invention is not intended to be limited to the particulars disclosed herein; rather, the present invention extends to all functionally equivalent structures, methods and uses, such as are within the scope of the appended claims.

What is claimed is:

1. A method comprising:

interlacing a first array of pixels of a first size with a second array of pixels of a second size, wherein the interlacing of the first array of pixels with the second array of pixels avoids a crossover of two or more photodiodes of the first array of pixels and the second array of pixels; and determining a condition to avoid overlap of photodiodes of each of the first array of pixels and the second array of pixels, comprising:

$P_2 > P_1;$ $P_2 = s \times P_1;$ $s =$ scaling factor:

$a = P_2 - P_1 - \text{min\_spacing\_rule};$ $P_2 = s \times P_1;$ and $2a^2/P_2^2 < FF < 4a^2/P_2^2,$ wherein, $P_1$ is a size of photodiodes of the first array of pixels, $P_2$ is a size of photodiodes of the second array of pixels, "a" is an area of the photodiodes, min_spacing_rule is a technology dependent minimum well spacing rule, and FF is a fill factor, which is a ratio of photosensitive part of the pixel to entire pixel area; and manufacturing the first array of pixels interlaced with the second array of pixels.

2. The method of claim 1, wherein the interlacing of the first array of pixels with the second array of pixels forms a repeatable modular block for an interlaced bi-sensor super-resolution pixel array.

3. The method of claim 2, wherein the repeatable modular block is copied and pasted to form a scalable array for a mega pixel design.

4. The method of claim 1, wherein pixels of the first array of pixels and the second array of pixels have photodiodes of a same size.

5. The method of claim 4, wherein the first array of pixels and the second array of pixels have pixels of a different pitch.

6. The method of claim 5, wherein a pitch of the first array of pixels and the second array of pixels are different in both a horizontal measurement and vertical measurement.

7. The method of claim 5, wherein the pitch of the first array of pixels and the second array of pixels are different in either a horizontal measurement or a vertical measurement.

8. The method of claim 5, wherein the pixels of the first array of pixels and the second array of pixels are within a specific ratio to ensure that the two or more photosensitive areas of the first array of pixels and the second array of pixels do not cross.

9. The method of claim 1, wherein only a single photodiode of each of the first array of pixels and the second array of pixels cross over when interlaced such that one photodiode laid out in the crossed location serves for both pixels of the array of pixels and the second array of pixels.

10. The method of claim 1, further comprising determining a minimum well spacing between the photodiodes of the array of pixels and the second array of pixels to avoid design rule check (DRC) violation.

11. The method of claim 1, wherein the scaling factor is in one dimension or two dimensions.

12. The method of claim 1, further comprising removing pixels of the first array of pixels or the second array of pixels to avoid DRC errors and/or crossing two or more photodiodes of the first array of pixels and the second array of pixels during the interlacing.

13. The method of claim 1, wherein the first array of pixels is a block of 5×5 pixels.

14. The method of claim 13, wherein the second array of pixels is a block of 4×4 pixels.

15. The method of claim 1, wherein an area of the photodiodes in the first array of pixels is equal to the area of the photodiodes in the second array of pixels.

\* \* \* \* \*